United States Patent
Liang et al.

(10) Patent No.: US 7,642,129 B2
(45) Date of Patent: Jan. 5, 2010

(54) BALL-MOUNTING METHOD FOR COPLANARITY IMPROVEMENT IN LARGE PACKAGE

(75) Inventors: Jimmy Liang, Chung-Li (TW); Gene Wu, Dayuan Township (TW); Steven Hsu, Chung-Ho (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 281 days.

(21) Appl. No.: 11/648,926

(22) Filed: Jan. 3, 2007

(65) Prior Publication Data

US 2008/0160671 A1 Jul. 3, 2008

(51) Int. Cl.
*H01L 21/00* (2006.01)
(52) U.S. Cl. .................. 438/108; 257/E23.021
(58) Field of Classification Search ......... 438/106–127, 438/612–617, 457; 257/E23.021
See application file for complete search history.

(56) References Cited

U.S. PATENT DOCUMENTS

| 5,435,482 | A | * | 7/1995 | Variot et al. ............... 228/254 |
| 5,626,277 | A | | 5/1997 | Kawada |
| 5,989,937 | A | * | 11/1999 | Variot et al. ............... 438/108 |
| 6,156,635 | A | * | 12/2000 | Mizuta ..................... 438/612 |
| 6,283,358 | B1 | * | 9/2001 | Ball ....................... 228/180.21 |
| 2002/0040754 | A1 | * | 4/2002 | Tomita et al. .............. 156/87 |

FOREIGN PATENT DOCUMENTS

| EP | 1 074 844 A2 | 2/2001 |
| TW | 490779 | 6/2002 |

OTHER PUBLICATIONS

"Replacement for Parylene® and Teflon® Coatings on Stainless and Ceramic Components: The Surface Energy Modified AMC148-18 Coating System for Metals and Ceramics: A Durable, Thin, Conformal Surface with Extremely Low Non-specific Protein Binding Characteristics," 2002, 5 pages, Advanced Materials Components Express, Bellefonte, PA 16823.

* cited by examiner

*Primary Examiner*—David A Zarneke
*Assistant Examiner*—Jenny L Wagner
(74) *Attorney, Agent, or Firm*—Slater & Matsil, L.L.P.

(57) ABSTRACT

A method of forming a packaging structure and the packages formed thereof are provided. The method includes providing a package having a top surface and placing solder balls on the top surface of the package. A coplanar surface is then placed against the solder balls, wherein the surface is non-adhesive. A reflow process is performed to the solder balls, so that top surfaces of the solder balls are substantially coplanar. The coplanar surface is then removed.

14 Claims, 5 Drawing Sheets

US 7,642,129 B2

BALL-MOUNTING METHOD FOR COPLANARITY IMPROVEMENT IN LARGE PACKAGE

TECHNICAL FIELD

This invention relates generally to manufacturing processes of integrated circuits, and more particularly to packaging processes, and even more particularly to methods for mounting ball grid array (BGA) balls onto package substrates.

BACKGROUND

Modern integrated circuits are formed on semiconductor chips. To increase manufacturing throughput and lower manufacturing cost, the integrated circuits are manufactured in semiconductor wafers, each containing many identical semiconductor chips. After the integrated circuits are made, semiconductor chips are sawed from the wafers and packaged before they can be used.

In typical packaging processes, semiconductor chips (also referred to as dies in the art) are first attached to package substrates. This includes physically securing the semiconductor chips on the package substrates, and connecting bonding pads on the semiconductor chips to bonding pads on the package substrates. Underfill, which typically comprises epoxy, is used to secure the packages. The semiconductor chips may be bonded using either flip-chip bonding or wire bonding. The packages are then attached to printed circuit boards (PCBs) through ball grid array (BGA) balls. Typically, BGA balls are mounted on the pads of the package substrates, and then the packages are mounted on PCBs through the BGA balls.

To make reliable electrical contacts between the package substrates and the PCBs, the BGA balls preferably have a good coplanarity, so that all BGA balls may have good contacts with the PCBs. However, the package substrates typically have warpage. In addition, during the packaging processes, such as flip-chip bonding, underfill dispensing and ball mounting are performed at elevated temperatures, and thus further worsens the warpage of the package substrates. Furthermore, BGA balls may vary in size. Therefore, the BGA balls are not naturally coplanar. This results in assembly yield loss due to the non-contact between BGA balls and PCBs.

FIG. 1 schematically illustrates a package having non-coplanar BGA balls. The package includes chip 2 bonded to package substrate 4. BGA balls 6 are mounted on package substrate 4. Assuming package substrate 4 has warpage, and the center portion is lower than edge portions, resulting in center BGA ball 6-1 being lower than edge ball 6-2.

FIG. 2 illustrates center ball 6-1 and edge ball 6-2. It reveals that due to the warpage of package substrate 4, there is a height difference D between center ball 6-1 and edge ball 6-2. When the package is mounted on a PCB board, edge ball 6-2 will have good contact with the PCB board, while center ball 6-1 is likely to be out of contact with the PCB board, and thus the resulting package fails.

Typically, it is preferred that for package substrates smaller than 37.5 mm×37.5 mm, the coplanarity, which measures a maximum distance at a point on the package substrate and allowed to deviate from a plane of other points, is less than about 6 mils. For package substrates larger than 37.5 mm×37.5 mm, the coplanarity is preferably less than about 8 mils. However, in conventional packaging practices, typically several percentages of the packages have warpage beyond these ranges, and hence resulting in yield loss. The problem worsens with the enlargement of the package substrates, which are increasingly used, for example, in system-in-package (SIP).

Accordingly, what is needed in the art is a method for solving the non-coplanarity problem of package substrates, and hence to increase production yield.

SUMMARY OF THE INVENTION

In accordance with one aspect of the present invention, a method of forming an integrated structure includes providing a package having a top surface and placing solder balls on the top surface of the package. A coplanar surface is then placed against the solder balls, wherein the surface is non-adhesive. A reflow process is performed to the solder balls, so that top surfaces of the solder balls are substantially coplanar. The coplanar surface is then removed In accordance with another aspect of the present invention, a method of forming an integrated circuit structure includes providing a package substrate having a top surface; placing solder balls on the top surface of the package substrate; and placing a plate on the solder balls, wherein a surface of the plate against the solder balls is substantially coplanar and non-adhesive. The solder balls are then reflowed, wherein the plate floats freely on the solder balls during the reflow process. The plate is removed after the solder balls solidify.

In accordance with yet another aspect of the present invention, a method of forming an integrated circuit structure includes providing a package substrate having a top surface, wherein the package substrate comprises dies bonded thereon, and wherein the package substrate comprises a plurality of metal pads on the top surface. The package substrate is confined in a space defined by guide pins. A plurality of ball grid array (BGA) balls is placed with each on one of the metal pads. A plate is placed on the solder balls, wherein a surface of the plate against the solder balls is substantially coplanar and non-adhesive, and wherein the plate fits substantially tightly in the space. The method further includes reflowing the solder balls, wherein no external force is applied on the plate. The solder balls are allowed to cool off, and the plate is removed.

In accordance with yet another aspect of the present invention, an integrated circuit package structure includes a package substrate comprising a first side and a second side; a plurality of the metal pads on the first side; and a plurality of solder balls mounted on the metal pads, wherein each of the plurality of solder balls comprises a first flat side attached to one of the metal pads, and a second flat side opposite the first flat side, and wherein the second flat sides of the solder balls are exposed.

In accordance with yet another aspect of the present invention, an apparatus for mounting solder balls on a package substrate includes a reflow boat and a plurality of guiding pins attached on the reflow boat, wherein the guiding pins define a space for fitting a package substrate. The apparatus further includes a movable surface being substantially coplanar and non-adhesive, wherein the surface has a size fitting substantially tightly in the space defined by the guiding pins. A tool is used to move the surface into the space and remove the surface out of the space.

The advantageous features of the present invention include improved coplanarity of solder balls on the surface of packages, pre-reflow non-coplanarity is substantially eliminated, and substantially no additional cost is introduced by the embodiments of the present invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method of mounting ball grid array (BGA) balls onto a package is provided. The intermediate stages of manufacturing preferred embodiments of the present invention are illustrated. The variations of the preferred embodiments are discussed. Throughout the various views and illustrative embodiments of the present invention, like reference numbers are used to designate like elements.

Figure 1:
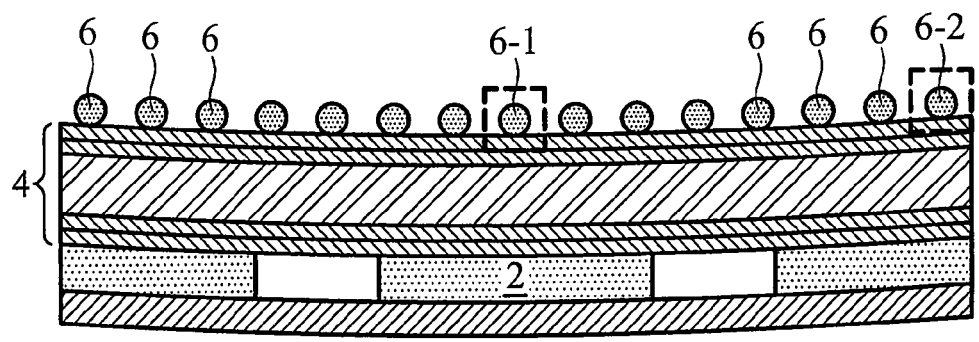
FIG. 1 illustrates a conventional package with BGA balls mounted thereon.
Figure 2:
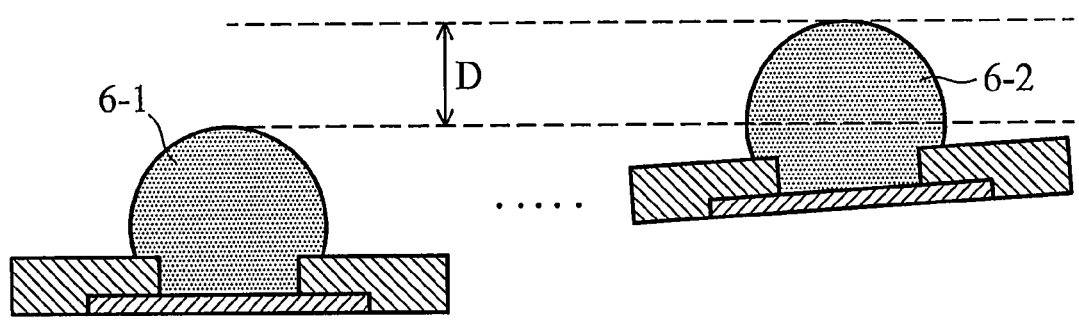
FIG. 2 illustrates a center ball and an edge ball shown in FIG. 1, wherein the center ball and the edge ball are non-coplanar.
Figure 3:
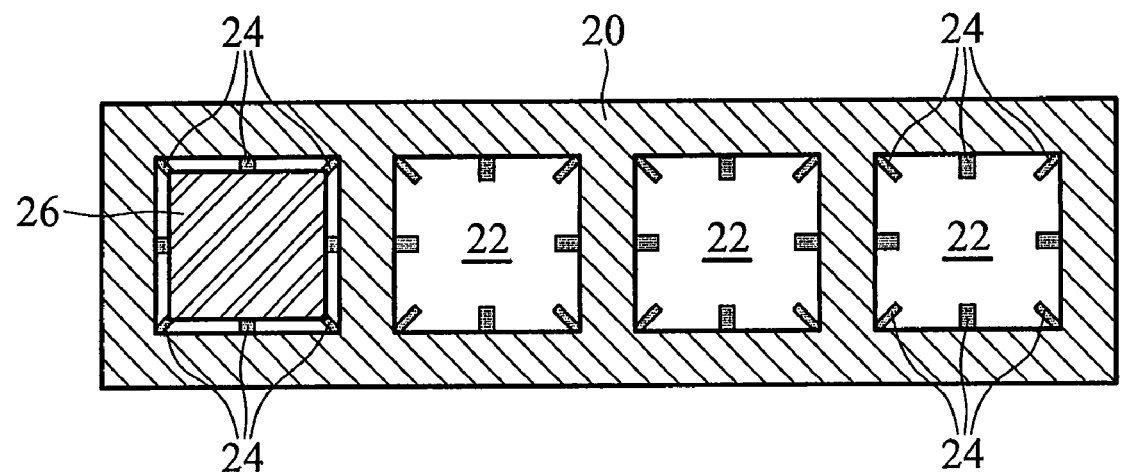
FIG. 3 illustrates a top view of an exemplary reflow boat, wherein a package substrate is placed in an opening in the reflow boat.

In BGA ball-mounting processes, BGA balls are first placed on metal pads, which are on a top surface of a package. A reflow is then performed to melt the BGA balls. When cooled, the BGA balls are bonded on the package. The reflow may be performed in a reflow boat. FIG. 3 illustrates a top view of an exemplary reflow boat 20, which includes a plurality of openings, each for confining a package therein. A plurality of guiding pins 24 is attached in each of the openings to guide the position of the package. Guiding pins 24 may be dispensed in different positions in the opening, and the number of guiding pins 24 may vary, depending on the design of the package. An exemplary package substrate 26 is placed inside one of the openings 22.

Figure 4:
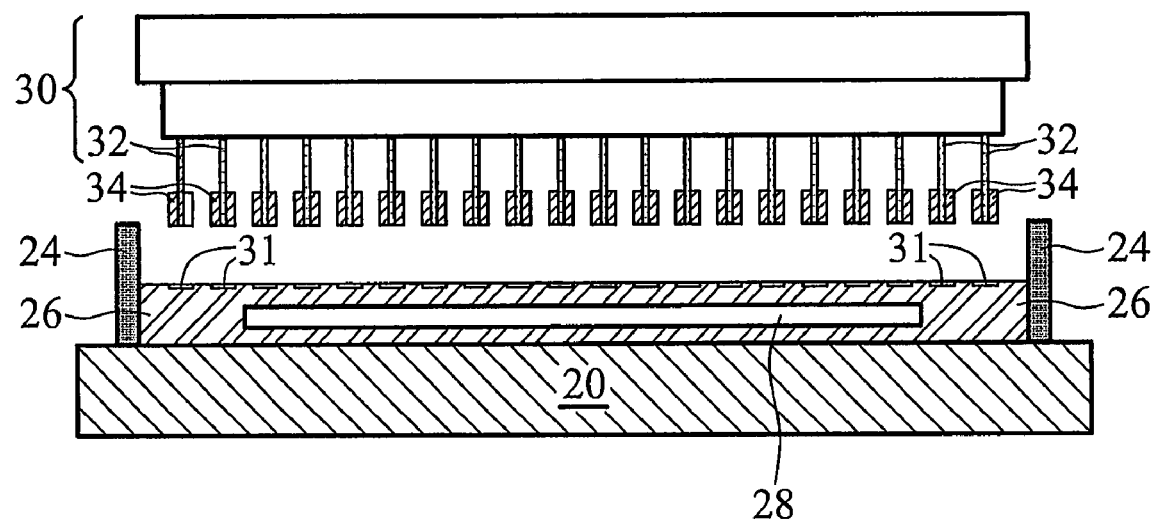
FIGS. 4 through 7 are cross-sectional views of intermediate stages in the manufacturing of an embodiment of the present invention.

FIGS. 4 through 7 illustrate cross-sectional views of intermediate steps in an exemplary ball-mounting process, wherein only one opening 22 and one package 26 is shown. In FIG. 4, reflow boat 20 is placed in ball-mounting equipment (not shown). For simplicity, only ball-mounting head 30 of the ball-mounting equipment is schematically illustrated. Package 26 is placed on a recessed portion (opening 22 in FIG. 3) of reflow boat 20, and is confined by guiding pins 24. Preferably, at this stage, semiconductor die(s) have already been bonded onto package 26, and underfill (not shown) has been dispensed. An exemplary die 28 is schematically illustrated. Metal pads 31 are formed on the surfaces of package 26.

Ball-mounting head 30 includes a plurality of pins 32, each located at a position corresponding to the positions of metal pads 31. The pins are likely to be arranged as an array, same as the metal pads on the surface of package 26. Pins 32 are used to pickup flux 34, which are then transferred to metal pads 31.

Figure 5:
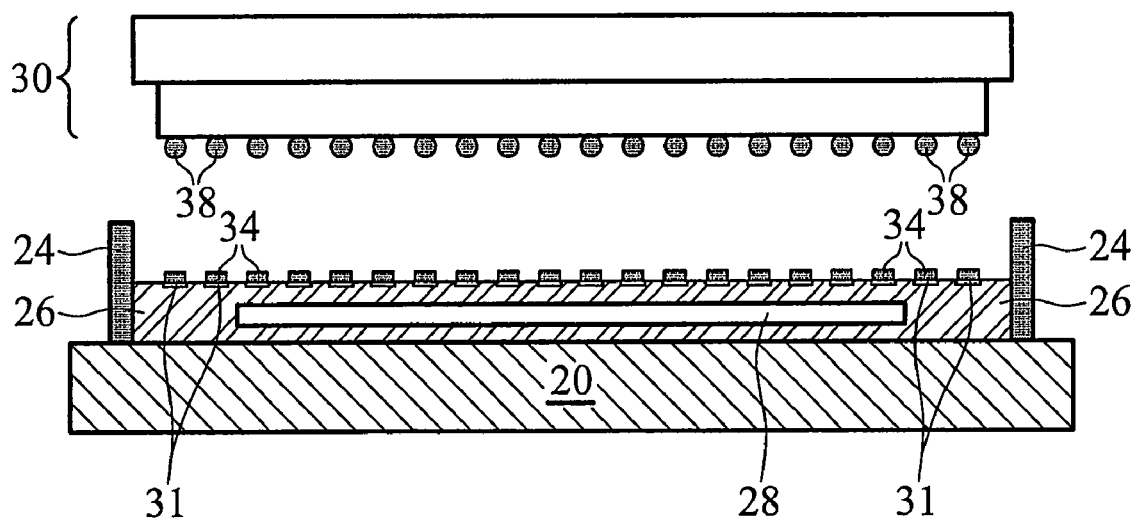

In FIG. 5, flux 34 have been attached on metal pads 31. Solder balls 38 are then picked up by ball-mounting head 30, which may be a different head of the ball-mounting equipment. Preferably, ball-mounting head 30 has a plurality of holes, each corresponding to the position of a metal pad on package 26. Solder balls 38, which are interchangeably referred to as BGA balls 38, are picked up by vacuuming the holes. Therefore, each of the solder balls 38 is located corresponding to one of flux 34. When air is filled into the holes, solder balls 38 are released. Accordingly, each solder ball 38 is placed on one of the flux 34.

Figure 6:
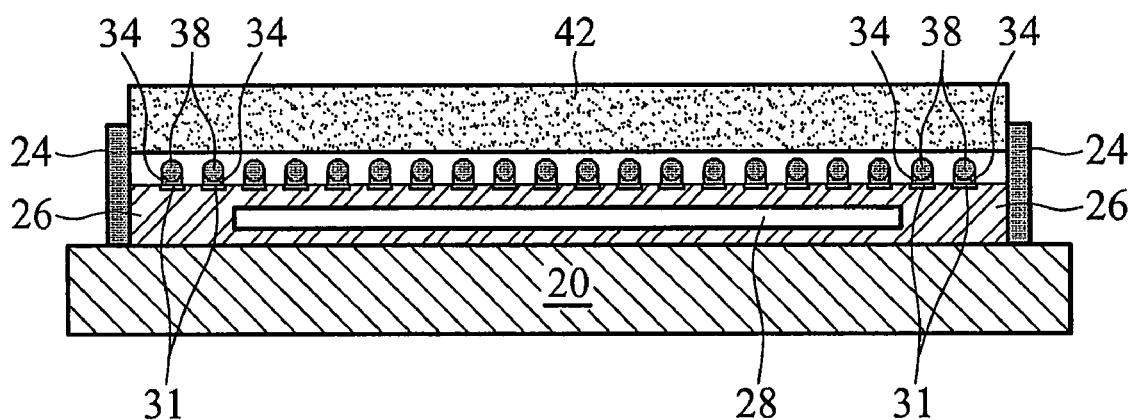

Plate 42 is then placed on solder balls 38, as is shown in FIG. 6. Preferably, plate 42 is large enough to cover all of the solder balls 38, but small enough to fit into the space defined by guiding pins 24 with substantially no space left on each of the edges. The coplanarity of plate 42 is at least better than the maximum non-coplanarity allowed for mounting package substrates onto printed circuit boards (PCBs) (hereinafter referred to as specified allowable non-coplanarity). In the preferred embodiment, the non-coplanarity of plate 42 is less than about ⅓ of the specified allowable non-coplanarity, and more preferably less than about ⅕ of the specified allowable non-coplanarity. Even more preferably, the non-coplanarity of plate 42 is as small as possible. For a 37.5 mm×37.5 mm package 26, the non-coplanarity of plate 42 is preferably less than about 1.0 mil.

Solder balls 38 are then reflowed by raising their temperature. Preferably, the reflow temperature is higher than about 200° C., and hence solder balls 38 are melted. With the help of flux 34, solder balls 38 are bonded on metal pads 31 of package 26. Preferably, plate 42 is formed of, and/or coated with, a non-adhesive material. The surface tension of the non-adhesive material is less than the surface tension of the solder balls 38 at liquid state. In an exemplary embodiment, plate 42 is coated with Teflon. Since plate 42 fits well in the space defined by guide pins 24, plate 42 does not shift in the direction parallel to the top surface of package 26, and thus solder balls 38 are not pushed sideway.

In the preferred embodiment, during the reflow process, no force is applied on plate 42, and thus plate 42 appears floating freely on the liquid solder balls 38. The weight of plate 42 causes solder balls to be coined (pressed to become flatter). Preferably, each of the solder balls 38 forms a flat surface where it contacts plate 42. The size of the flat surface is related to the weight of plate 42, and the greater the weight is, the greater the flat surface a ball will have. Apparently, too heavy of a plate 42 will crush the solder balls 38. With a suitable weight, all solder balls 38 are in good contact with plate 42.

It is to be realized that the surface of package 26 has certain non-coplanarity. In addition, solder balls 38 vary in size, and thus the top surface of solder balls 38 would have been non-coplanar if plate 42 is not applied during the reflow process. An advantageous feature of the present invention is that by using the weight of plate 42, the reflow process automatically calibrates itself. If the total contact area between solder balls 38 and plate 42 is too small, the supporting force will be too small, and plate 42 will automatically lower itself to increase the contact area, until all of solder balls 38 are in contact with plate 42, and thus the supporting force balances the weight of plate 42. The optimum weight of plate 42 is related to the density and size of solder balls 38. The greater density and/or the greater size of solder balls 38 demands a heavier plate 42. The optimum weight of plate 42 can be determined through experiments.

In alternative embodiments, during the reflow process, plate 42 is not applied, and a substantially coplanar surface is placed against top surfaces of BGA balls 38. The surface is pressed against the top surfaces of BGA balls 38 in a controllable way (for example, by controlling the force applied on the coplanar surface, or the distance between the planar surface and the top surface of package 26), such that the coplanar surface is in contact with all of solder balls 38. Such a method, however, needs a well-controlled pressing force. Similarly, the coplanar surface is non-adhesive.

Figure 7:
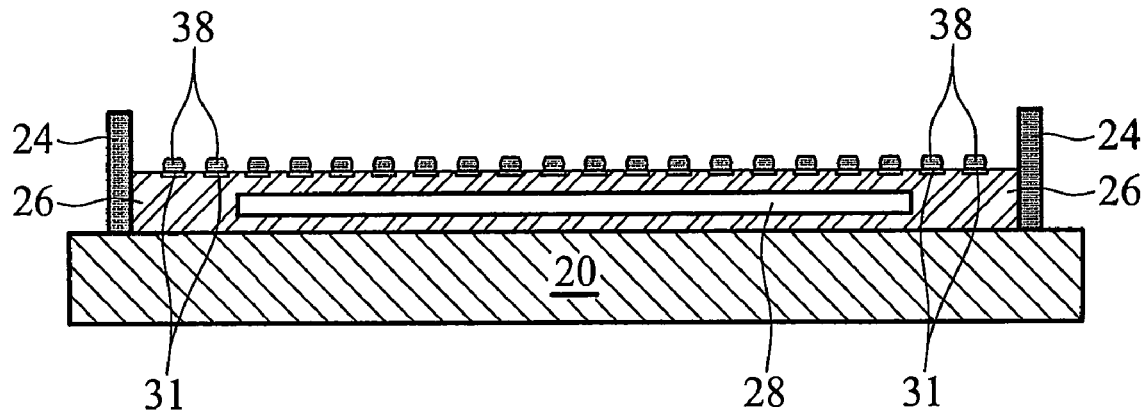
Figure 8:
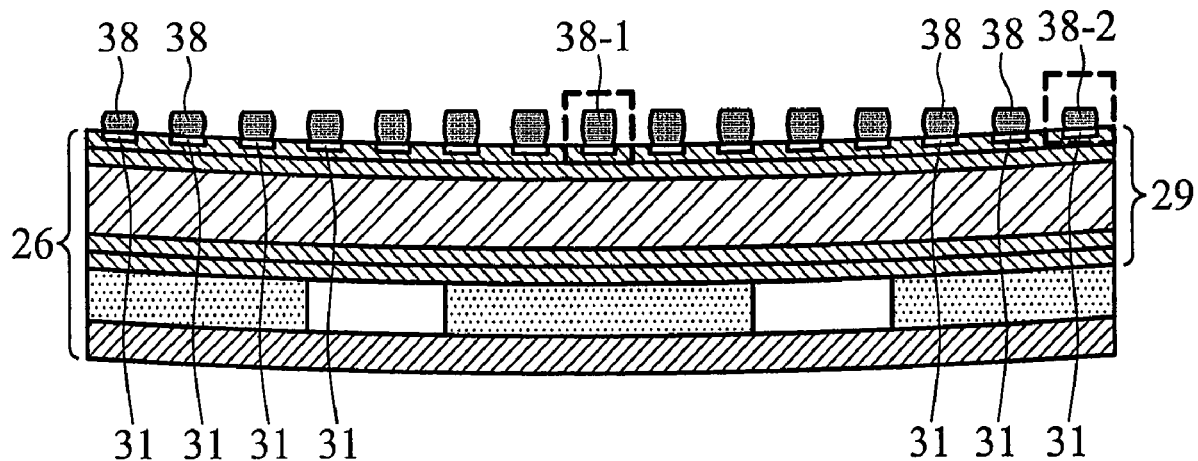
FIG. 8 illustrates a package after BGA balls are mounted using the processes illustrated in FIGS. 4 through 7.
Figure 9:
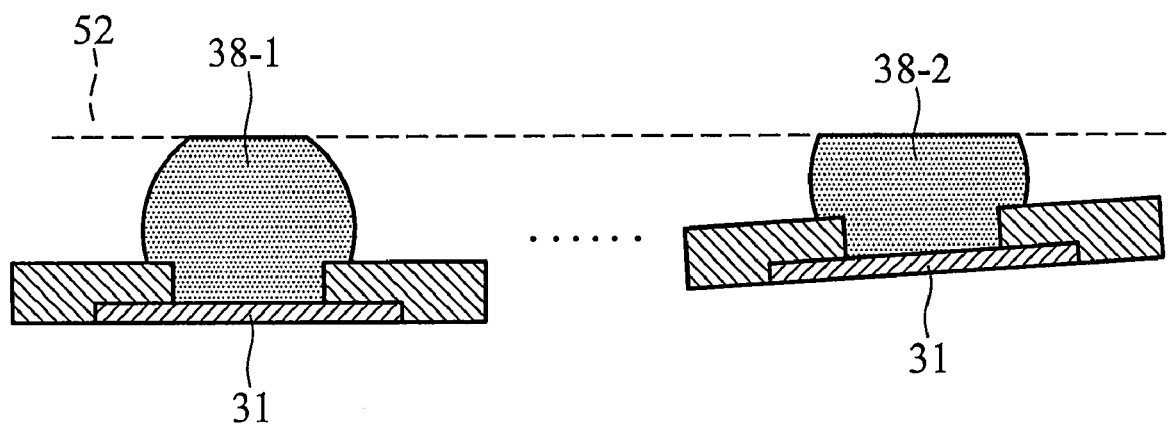
FIG. 9 illustrates a center ball and an edge ball on the package shown in FIG. 8, wherein the top surfaces of the center ball and the edge ball are coplanar and are substantially flat.

Referring to FIG. 7, after the reflow process, the solder balls are allowed to cool off and solidify. Plate 42 is then removed. In the final structure, the top surfaces of solder balls 38 are substantially coplanar. FIG. 8 schematically illustrates in detail a resulting package 26 including package substrate 29 and solder balls 38 mounted thereon. Assuming package substrate 29 has warpage, and the center portion is lower than the edge portions, the resulting center balls will be lower than the edge balls. A center ball 38-1 and an edge ball 38-2 are shown in detail in FIG. 9. Due to the warpage, if the embodiment of the present invention is not used, the top surface of center ball 38-1 will be lower than the top surface of edge ball 38-2 by a distance, which will cause non-contact of center ball 38-1. By using the embodiments of the present invention, the top surfaces of solder balls 38-1 and 38-2 are on same plane 52.

By using the embodiments of the present invention, the pre-reflow non-coplanarity of solder balls 38 is effectively eliminated, wherein the pre-reflow non-coplanarity is caused by warpage of package substrate 29 in package 26, warpage caused by dispensing underfill in package 26, and the like. The only non-coplanarity not eliminated by the embodiments of the present invention is reflow-related non-coplanarity, such as the non-coplanarity introduced by the cooling-off step of package 26 after the solder balls have been solidified. This part of non-coplanarity, however, is relatively small. Experiment data have shown that this part of non-coplanarity is only about 1 mil to about 2 mils, which is significantly less than the specified maximum allowable non-coplanarity, which may reach as great as about 6 mils to about 8 mils.

The embodiments of the present invention have several advantageous features. The coplanarity of the BGA balls can be significantly improved for board-level assembly, since pre-reflow non-coplanarity is substantially eliminated. Such an improvement comes with no penalty of additional process, since the weight applying step has been integrated in the reflow process of the BGA balls.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
   providing a package having a top surface;
   placing solder balls on the top surface of the package;
   placing a coplanar surface against the solder balls, wherein the coplanar surface is non-adhesive;
   reflowing the solder balls, so that top surfaces of the solder balls are substantially coplanar, top surfaces of all solder balls placed on the top surface of the package having a flat surface; and
   removing the coplanar surface,
   wherein the coplanar surface is a surface of a plate, and wherein the plate freely floats on the solder balls during the step of reflowing.

2. The method of claim 1, wherein during the step of reflowing the solder balls, all of the solder balls placed on the top surface of the package are in physical contact with the coplanar surface.

3. The method of claim 1, wherein the step of removing the coplanar surface is performed after the solder balls are solidified.

4. The method of claim 1, wherein the coplanar surface is coated with Teflon.

5. The method of claim 1, wherein the package has a size of larger than about 37.5 mm ×37.5 mm, and wherein the coplanar surface has a coplanarity of less than about 1.0 mil.

6. The method of claim 1, wherein the package comprises semiconductor dies bonded onto a package substrate.

7. A method of forming an integrated circuit structure, the method comprising:
   providing a package substrate having a top surface;
   placing solder balls on the top surface of the package substrate;
   placing a plate on the solder balls, wherein a surface of the plate against the solder balls is substantially coplanar and non-adhesive;
   reflowing the solder balls, wherein the plate floats freely on the solder balls; and
   removing the plate after the solder balls solidify.

8. The method of claim 7, wherein during the step of reflowing the solder balls, each of the solder balls placed on the top surface of the package substrate is in physical contact with the plate.

9. The method of claim 7, wherein the surface of the plate is coated with Teflon.

10. The method of claim 7, wherein the integrated circuit structure further comprises dies bonded on the package substrate.

11. A method of forming an integrated circuit structure, the method comprising:
    providing a package substrate having a top surface, wherein the package substrate comprises dies bonded thereon, and wherein the package substrate comprises a plurality of metal pads on the top surface;
    confining the package substrate in a space defined by guide pins;
    placing a plurality of ball grid array (BGA) balls each on one of the plurality of metal pads;
    placing a plate on the plurality of BGA balls, wherein a surface of the plate against the plurality of BGA balls is substantially coplanar and non-adhesive, and wherein the plate fits substantially tightly in the space;

reflowing the plurality of BGA balls, wherein a weight of the plate forms a flattened surface on the plurality of BGA balls;

allowing the plurality of BGA balls to cool off; and removing the plate.

12. The method of claim 11 further comprising applying flux on the plurality of metal pads before the step of placing the plurality of BGA balls.

13. The method of claim 11, wherein the surface of the plate comprises Teflon.

14. A method of forming an integrated circuit structure, the method comprising:

providing a package substrate having a top surface, wherein the package substrate comprises dies bonded thereon, and wherein the package substrate comprises a plurality of metal pads on the top surface;

confining the package substrate in a space defined by guide pins;

placing a plurality of ball grid array (BGA) balls each on one of the plurality of metal pads;

placing a plate on the plurality of BGA balls, where a surface of the plate against the plurality of BGA balls is substantially coplanar and non-adhesive, and wherein the plate fits substantially tightly in space;

reflowing the plurality of BGA balls, wherein a weight of the plate forms a flattened surface on the plurality of BGA balls;

allowing the plurality of BGA balls to cool off; and removing the plate, wherein the plate has a weight to allow all of the plurality of BGA balls to be in contact with the surface of the plate during the step of reflowing, and wherein the weight is less than a weight for crushing the plurality of BGA balls when the plurality of BGA balls are reflowed.

* * * * *